(12) United States Patent
Nie et al.

(10) Patent No.: US 9,136,418 B2
(45) Date of Patent: Sep. 15, 2015

(54) OPTOELECTRONIC DEVICES INCLUDING HETEROJUNCTION AND INTERMEDIATE LAYER

(75) Inventors: Hui Nie, Cupertino, CA (US); Brendan M. Kayes, San Francisco, CA (US); Isik C. Kizilyalli, San Francisco, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 647 days.

(21) Appl. No.: 13/451,455

(22) Filed: Apr. 19, 2012

(65) Prior Publication Data

US 2012/0204942 A1 Aug. 16, 2012

Related U.S. Application Data

(60) Division of application No. 12/939,077, filed on Nov. 3, 2010, now abandoned, and a continuation-in-part of application No. 12/605,108, filed on Oct. 23, 2009, now Pat. No. 8,937,244.

(60) Provisional application No. 61/107,954, filed on Oct. 23, 2008.

(51) Int. Cl.
*H01L 21/04* (2006.01)
*H01L 31/0735* (2012.01)
(Continued)

(52) U.S. Cl.
CPC .... *H01L 31/0735* (2013.01); *H01L 31/022441* (2013.01); *H01L 31/1896* (2013.01); *Y02E 10/52* (2013.01); *Y02E 10/544* (2013.01)

(58) Field of Classification Search
USPC ........................................................ 257/184
See application file for complete search history.

(56) References Cited

U.S. PATENT DOCUMENTS 3,990,101 A 11/1976 Ettenberg et al.
4,015,280 A 3/1977 Matsushita et al.
(Continued)

FOREIGN PATENT DOCUMENTS

EP 0595634 A1 5/1994
JP 63-211775 9/1988
(Continued)

OTHER PUBLICATIONS

Peter A. Lewis, "Pigment Handbook vol. I: Properties and Economics, 2nd Edition", John Wiley & Sons, New York, pp. 790-791 (1988).
(Continued)

*Primary Examiner* — Jesse Y Miyoshi
*Assistant Examiner* — Abul Kalam
(74) *Attorney, Agent, or Firm* — Sawyer Law Group, P.C.

(57) ABSTRACT

Embodiments generally relate to optoelectronic semiconductor devices such as solar cells. In one aspect, a device includes an absorber layer made of gallium arsenide (GaAs) and having only one type of doping. An emitter layer is located closer than the absorber layer to a back side of the device and is made of a different material and having a higher bandgap than the absorber layer. A heterojunction is formed between the emitter layer and the absorber layer, and a p-n junction is formed between the emitter layer and the absorber layer and at least partially within the different material at a location offset from the heterojunction. An intermediate layer is located between the absorber layer and the emitter layer and provides the offset of the p-n junction from the heterojunction, and includes a graded layer and an ungraded back window layer.

12 Claims, 5 Drawing Sheets

(51) Int. Cl.
*H01L 31/0224* (2006.01)
*H01L 31/18* (2006.01)

(56) References Cited

U.S. PATENT DOCUMENTS

| | | | |
|---|---|---|---|
| 4,017,332 A | 4/1977 | James |
| 4,094,704 A | 6/1978 | Milnes |
| 4,107,723 A | 8/1978 | Kamath |
| 4,191,593 A | 3/1980 | Cacheux |
| 4,197,141 A | 4/1980 | Bozler et al. |
| 4,295,002 A | 10/1981 | Chappell et al. |
| 4,338,480 A | 7/1982 | Antypas et al. |
| 4,385,198 A | 5/1983 | Rahilly |
| 4,400,221 A | 8/1983 | Rahilly |
| 4,410,758 A | 10/1983 | Grolitzer |
| 4,419,533 A | 12/1983 | Czubatyj et al. |
| 4,444,992 A | 4/1984 | Cox, III |
| 4,479,027 A | 10/1984 | Todorof |
| 4,497,974 A | 2/1985 | Deckman et al. |
| 4,633,030 A | 12/1986 | Cook |
| 4,667,059 A | 5/1987 | Olson |
| 4,889,656 A | 12/1989 | Flynn et al. |
| 4,916,503 A | 4/1990 | Uematsu et al. |
| 4,989,059 A | 1/1991 | Micheels et al. |
| 4,997,491 A | 3/1991 | Hokuyo et al. |
| 5,116,427 A | 5/1992 | Fan et al. |
| 5,217,539 A | 6/1993 | Fraas et al. |
| 5,223,043 A | 6/1993 | Olson et al. |
| 5,316,593 A | 5/1994 | Olson et al. |
| 5,330,585 A | 7/1994 | Chang et al. |
| 5,342,453 A | 8/1994 | Olson |
| 5,376,185 A | 12/1994 | Wanlass |
| 5,385,960 A | 1/1995 | Emmons et al. |
| 5,468,652 A | 11/1995 | Gee |
| 6,107,563 A | 8/2000 | Nakanishi et al. |
| 6,166,218 A | 12/2000 | Ravichandran et al. |
| 6,166,318 A | 12/2000 | Freeouf |
| 6,229,084 B1 | 5/2001 | Katsu |
| 6,231,931 B1 | 5/2001 | Blazey et al. |
| 6,255,580 B1 | 7/2001 | Karam et al. |
| 6,372,981 B1 | 4/2002 | Ueda et al. |
| 6,617,508 B2 | 9/2003 | Kilmer et al. |
| 7,038,250 B2 | 5/2006 | Sugiyama et al. |
| 2001/0027805 A1 | 10/2001 | Ho et al. |
| 2002/0053683 A1 | 5/2002 | Hill et al. |
| 2002/0144724 A1 | 10/2002 | Kilmer et al. |
| 2002/0179141 A1 | 12/2002 | Ho et al. |
| 2003/0070707 A1 | 4/2003 | King et al. |
| 2003/0140962 A1 | 7/2003 | Sharps et al. |
| 2003/0222278 A1 | 12/2003 | Liu et al. |
| 2004/0166681 A1 | 8/2004 | Iles et al. |
| 2006/0081963 A1 | 4/2006 | Rehder et al. |
| 2006/0090790 A1 | 5/2006 | Kobayashi et al. |
| 2006/0144435 A1 | 7/2006 | Wanlass |
| 2006/0162767 A1 | 7/2006 | Mascarenhas et al. |
| 2006/0207651 A1 | 9/2006 | Posthuma et al. |
| 2006/0255340 A1 | 11/2006 | Manivannan et al. |
| 2007/0131275 A1 | 6/2007 | Kinsey et al. |
| 2007/0137695 A1 | 6/2007 | Fetzer et al. |
| 2007/0137698 A1 | 6/2007 | Wanlass et al. |
| 2007/0235074 A1 | 10/2007 | Henley et al. |
| 2007/0277874 A1 | 12/2007 | Dawson-Elli et al. |
| 2008/0245409 A1 | 10/2008 | Varghese et al. |
| 2009/0283802 A1 | 11/2009 | Henderson et al. |
| 2010/0006143 A1 | 1/2010 | Welser |
| 2010/0096010 A1 | 4/2010 | Welser |
| 2010/0126552 A1 | 5/2010 | Kizilyalli et al. |
| 2010/0126570 A1 | 5/2010 | Kizilyalli et al. |
| 2010/0126571 A1 | 5/2010 | Kizilyalli et al. |
| 2010/0126572 A1 | 5/2010 | Kizilyalli et al. |
| 2010/0132774 A1 | 6/2010 | Borden |
| 2010/0132780 A1 | 6/2010 | Kizilyalli et al. |
| 2012/0031478 A1 | 2/2012 | Boisvert et al. |

FOREIGN PATENT DOCUMENTS

| | | |
|---|---|---|
| JP | 3-285368 | 12/1991 |
| JP | 06-244443 | 9/1994 |
| JP | 07-007148 | 1/1995 |
| JP | 8-130321 | 5/1996 |
| KR | 10-0762772 | 10/2007 |
| WO | WO 02065553 A1 | 8/2002 |

OTHER PUBLICATIONS

M. M. Sanfacon et al, "Analysis of AlGaAs/GaAs Solar Cell Structures by Optical Reflectance Spectroscopy" IEEE Transactions on Electron Devices, vol. 37, No. 2, Feb. 1990, pp. 450-454.

Q. M. Zhang et al., "Effects of Displaced p-n Junction of Heterojunction Bipolar Transistors", IEEE Transactions on Electron Devices, vol. 39, No. 11, Nov. 1992, pp. 2430-2437.

B. H. Floyd, et al., "An N—AlGaAs P—GaAs Graded Heterojunction for High Concentration Ratios," pp. 81-86, IEEE, 1987.

Hiroshi Yamaguchi, et al., "Development Status of "Space Solar Sheet"", IEEE PVSC Proceedings, 2008.

Tatsuya Takamoto, et al., "Paper-Thin InGaP/GaAs Solar Cells", IEEE PVSC Proceedings, pp. 1769-1772, 2006.

B. H. Floyd, et al., "An N-AlGaAs P-GaAs Graded Heterojunction for High Concentration Ratios," pp. 81-86, IEEE, 1987.

OPTOELECTRONIC DEVICES INCLUDING HETEROJUNCTION AND INTERMEDIATE LAYER

CROSS REFERENCE TO RELATED APPLICATIONS

The present application is a divisional application of copending U.S. patent application Ser. No. 12/939,077, entitled "Optoelectronic Devices Including Heterojunction," filed on Nov. 3, 2010 and assigned to the assignee of the present application.

This application is a Continuation-in-Part claiming priority to U.S. patent application Ser. No. 12/605,108, filed on Oct. 23, 2009, entitled "Photovoltaic Device," which claims priority to U.S. Provisional Application No. 61/107,954, filed on Oct. 23, 2008.

BACKGROUND

1. Field of the Invention

Embodiments of the invention generally relate to optoelectronic semiconductor devices such as photovoltaic devices including solar cells, and methods for fabricating such optoelectronic devices.

2. Description of the Related Art

As fossil fuels are being depleted at ever-increasing rates, the need for alternative energy sources is becoming more and more apparent. Energy derived from wind, from the sun, and from flowing water offer renewable, environment-friendly alternatives to fossil fuels, such as coal, oil, and natural gas. Being readily available almost anywhere on Earth, solar energy may someday be a viable alternative.

To harness energy from the sun, the junction of a solar cell absorbs photons to produce electron-hole pairs, which are separated by the internal electric field of the junction to generate a voltage, thereby converting light energy to electric energy. The generated voltage can be increased by connecting solar cells in series, and the current may be increased by connecting solar cells in parallel. Solar cells may be grouped together on solar panels. An inverter may be coupled to several solar panels to convert DC power to AC power.

Nevertheless, the currently high cost of producing solar cells relative to the low efficiency levels of contemporary devices is preventing solar cells from becoming a mainstream energy source and limiting the applications to which solar cells may be suited. During conventional fabrication processes for photovoltaic devices, metallic contacts are often deposited with a vapor deposition process, and usually heated to temperatures of over 300° C. during thermal anneal processes. These high temperature processes are generally expensive due to the excessive consumption of time and energy. Also, the high temperature processes often damage sensitive materials contained within the photovoltaic device.

Accordingly, there is a need for optoelectronic devices with increased efficiency and methods for fabricating such optoelectronic devices at reduced costs when compared to conventional solar cells.

SUMMARY

Embodiments generally relate to optoelectronic semiconductor devices including photovoltaic cells and the fabrication processes for forming such devices.

In one embodiment, an optoelectronic semiconductor device includes an absorber layer made of gallium arsenide (GaAs) and having one type of doping. An emitter layer is located closer than the absorber layer to a back side of the device, the emitter layer made of a different material and having a higher bandgap than the absorber layer. A heterojunction is formed between the emitter layer and the absorber layer, and a p-n junction is formed between the emitter layer and the absorber layer at a location offset from the heterojunction. The p-n junction causes a voltage to be generated in the device in response to the device being exposed to light at a front side of the device. An intermediate layer located between the absorber layer and the emitter layer and provides the offset of the p-n junction from the heterojunction. The intermediate layer has the same type of doping as the absorber layer and includes a graded layer having a material gradation from GaAs at a side closer to the absorber layer to the different material of the emitter layer, and a back window layer not having the gradation and having an approximately uniform composition of the different material.

In another embodiment, a solar cell includes an absorber layer made of gallium arsenide (GaAs) and having one type of doping, and an emitter layer made of a different material and having a higher bandgap than the absorber layer. An intermediate layer is provided between the absorber layer and the emitter layer, the intermediate layer having the same type of doping as the absorber layer, wherein the intermediate layer includes a material gradation from GaAs at a side closer to the absorber layer, to the different material of the emitter layer at a side closer to the emitter layer. The intermediate layer includes a graded layer having the gradation, and a back window layer not having the gradation and having an approximately uniform composition of the different material. A heterojunction is formed between the emitter layer and the absorber layer, and a p-n junction is formed between the emitter layer and the absorber layer and at least partially within the different material at a location offset from the heterojunction. The p-n junction causes a voltage to be generated in the cell in response to the device being exposed to light at a front side of the solar cell.

DETAILED DESCRIPTION

Embodiments generally relate to optoelectronic semiconductor devices and processes including photovoltaic devices and processes, and more specifically relate to photovoltaic cells and the fabrication processes for forming such photovoltaic cells and metallic contacts. Some of the fabrication processes include epitaxially growing thin films of gallium arsenide materials which are further processed by an epitaxial lift off (ELO) process. Some embodiments of photovoltaic cells described herein provide a gallium arsenide based cell containing an n-type film stack disposed over a p-type film stack, such that the n-type film stack is facing the front or sun side while the p-type film stack is on the back side of the cell.

In one embodiment, the photovoltaic cell is a two-sided photovoltaic cell and has an n-metal contact disposed on the front side while a p-metal contact is disposed on the back side of the cell. In another embodiment, the photovoltaic cell is a single-sided photovoltaic cell and has the n-metal and the p-metal contacts disposed on the back side of the cell. Embodiments of an optoelectronic device include an absorber layer, an emitter layer, a heterojunction formed between emitter and absorber layers, and a p-n junction between the emitter layer and the absorber layer and at a location offset from the heterojunction, as described in greater detail below. Described innovations may allow for greater efficiency and flexibility in photovoltaic devices when compared to conventional solar cells.

Some embodiments provide processes for epitaxially growing Group III-V materials at high growth rates of greater than 5 μm/hr, such as about 10 μm/hr or greater, about 20 μm/hr or greater, about 30 μm/hr or greater, such as about 60 μm/hr or greater including about 100 μm/hr or greater or about 120 μm/hr or greater. The Group III-V materials are thin films of epitaxially grown layers which contain gallium arsenide, gallium aluminum arsenide, gallium aluminum indium phosphide, gallium aluminum phosphide, or combinations thereof.

Figure 1A:
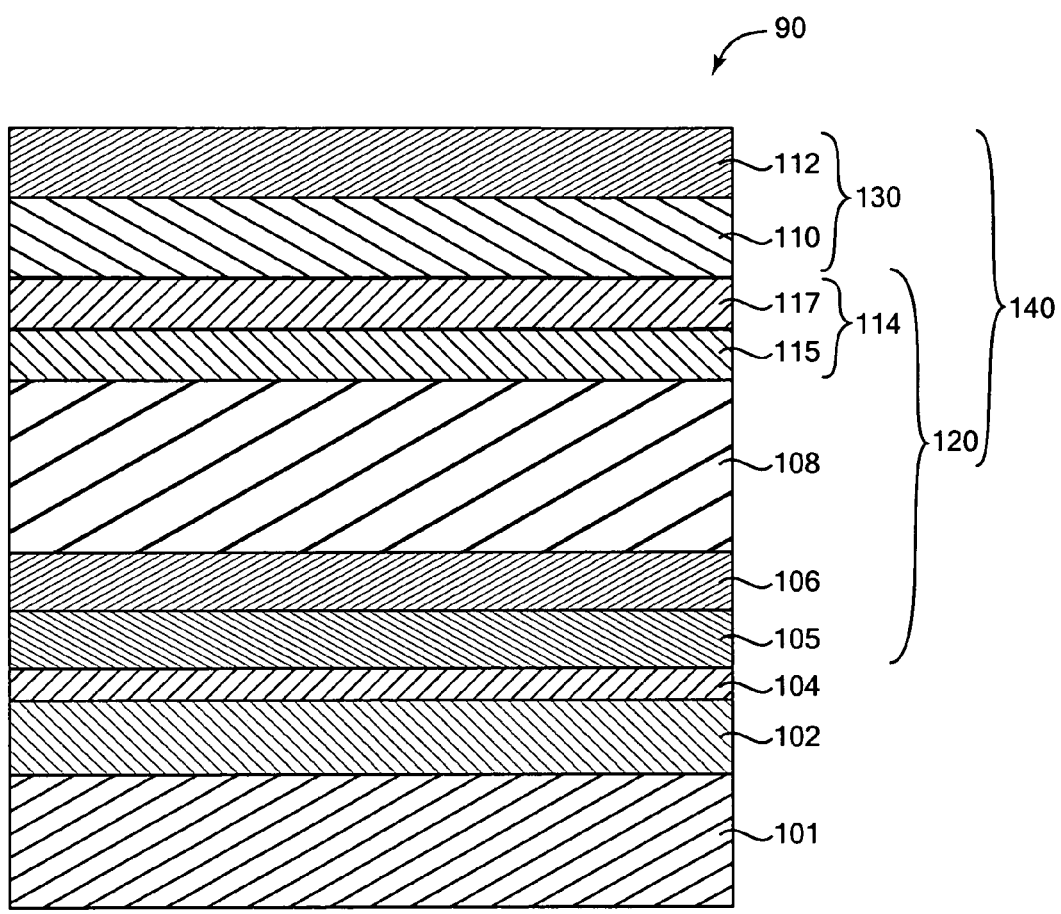
FIGS. 1A-1B depict a cross-sectional view of a photovoltaic unit in accordance with one embodiment described herein.

FIG. 1A illustrates a cross-sectional view of a photovoltaic unit 90 containing a gallium arsenide based cell 140 coupled with a growth wafer 101 by a sacrificial layer 104 disposed therebetween. Multiple layers of epitaxial materials containing varying compositions are deposited within the photovoltaic unit 90 including the buffer layer 102, the sacrificial layer 104, as well as many of the layers contained within the gallium arsenide based cell 140. The various layers of epitaxial materials may be grown or otherwise formed by deposition process such as a chemical vapor deposition (CVD) process, a metal organic CVD (MOCVD) process, or a molecular beam epitaxy (MBE) process.

Figure 1B:
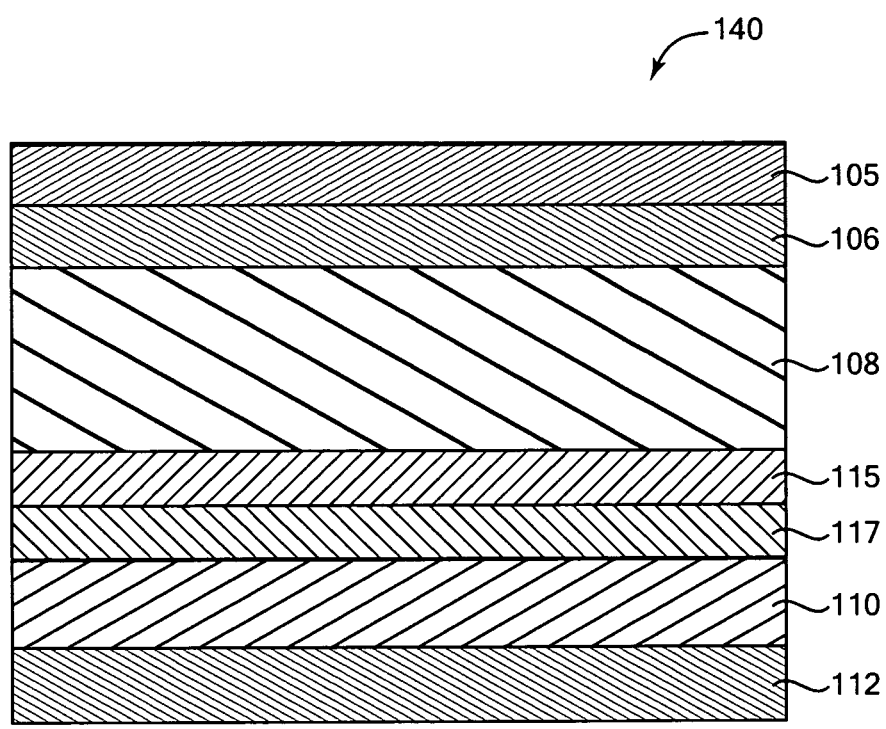

In another embodiment described herein, the photovoltaic unit 90 may be exposed to a wet etch solution in order to etch the sacrificial layer 104 and to separate the gallium arsenide based cell 140 from the growth wafer 101 during an epitaxial lift off (ELO) process. The wet etch solution generally contains hydrofluoric acid, and may also contain various additives, buffers, and/or surfactants. The wet etch solution selectively etches the sacrificial layer 104 while preserving the gallium arsenide based cell 140 and the growth wafer 101. Once separated, the gallium arsenide based cell 140, as depicted in FIG. 1B, may be further processed to form a variety of photovoltaic devices, including photovoltaic cells and modules, as described by several embodiments herein.

The Group III-V materials are thin films of epitaxially grown layers which may contain gallium arsenide, gallium aluminum arsenide, among others. Some layers, such as the window layer may contain additional materials including gallium aluminum indium phosphide, gallium aluminum phosphide, or combinations thereof. The epitaxially grown layers may be formed by growing Group III-V materials during a high growth rate vapor deposition process. The high growth rate deposition process allows for growth rates of greater than 5 μm/hr, such as about 10 μm/hr or greater, about 20 μm/hr or greater, about 30 μm/hr or greater, such as about 60 μm/hr or greater including about 100 μm/hr or greater or about 120 μm/hr or greater as compared to the conventional observed deposition rates of less than 5 μm/hr.

The process includes heating a wafer to a deposition temperature of about 550° C. or greater, within a processing system, exposing the wafer to a deposition gas containing a chemical precursor, such as gallium precursor gas and arsine for a gallium arsenide deposition process, and depositing a layer containing gallium arsenide on the wafer. The high growth rate deposition process may be utilized to deposit a variety of materials, including gallium arsenide, aluminum gallium arsenide, aluminum gallium phosphide, aluminum gallium indium phosphide, aluminum indium phosphide, alloys thereof, dopant variants thereof, or combinations thereof. In some embodiments of the deposition process, the deposition temperature may be within a range from about 550° C. to about 900° C. In other examples, the deposition temperature may be within a range from about 600° C. to about 800° C. In other examples, the deposition temperature may be within a range from about 650° C. to about 750° C. In other examples, the deposition temperature may be within a range from about 650° C. to about 720° C.

In one embodiment, a deposition gas may be formed by combining or mixing two, three, or more chemical precursors within a gas manifold prior to entering or passing through the showerhead. In another embodiment, the deposition gas may be formed by combining or mixing two, three, or more chemical precursors within a reaction zone after passing through the showerhead. The deposition gas may also contain one, two or more carrier gases, which may also be combined or mixed with the precursor gases prior to or subsequent to passing through the showerhead.

The deposition gas may contain one or multiple chemical precursors of gallium, aluminum, indium, arsenic, phosphorus, or others. The deposition gas may contain a gallium precursor gas which is an alkyl gallium compound, such as trimethylgallium or triethylgallium. The deposition gas may further contain an aluminum precursor gas which is an alkyl aluminum compound, such as trimethylaluminum or triethylaluminum. The deposition gas may further contain an indium precursor gas which is an alkyl indium compound, such as trimethylindium.

In some embodiments, the deposition gas further contains a carrier gas. The carrier gas may contain hydrogen ($H_2$), nitrogen ($N_2$), a mixture of hydrogen and nitrogen, argon, helium, or combinations thereof. In many examples, the carrier gas contains hydrogen, nitrogen, or a mixture of hydrogen and nitrogen. Each of the deposition gases may be provided to the processing chamber at a flow rate from about 5 sccm (standard cubic centimeters per minute) to about 300 sccm. The carrier gases may be provided to the processing chamber at a flow rate from about 500 sccm to about 3,000 sccm.

In other embodiments, the deposition gas contains the arsine and the gallium precursor gas at an arsine/gallium precursor ratio of about 3 or greater, or may be about 4 or greater, or may be about 5 or greater, or may be about 6 or greater, or may be about 7 or greater. In some examples, the arsine/gallium precursor ratio may be within a range from about 5 to about 10. In other embodiments, the Group III-V materials may be formed or grown from a deposition gas containing a ratio of Group V precursor to Group III precursor of about 30:1, or 40:1, or 50:1, or 60:1, or greater. In some examples, the deposition gas has a phosphine/Group III precursor of about 50:1.

The processing system may have an internal pressure within a range from about 20 Torr to about 1,000 Torr. In some embodiments, the internal pressure may be ambient or greater than ambient, such as within a range from about 760 Torr to about 1,000 Torr. In some examples, the internal pressure may be within a range from about 800 Torr to about 1,000 Torr. In other examples, the internal pressure is within a range from about 780 Torr to about 900 Torr, such as from about 800 Torr to about 850 Torr. In other embodiments, the internal pressure may be ambient or less than ambient, such as within a range from about 20 Torr to about 760 Torr, preferably, from about 50 Torr to about 450 Torr, and more preferably, from about 100 Torr to about 250 Torr.

The deposition processes for depositing or forming Group III-V materials, as described herein, may be conducted in a single wafer deposition chamber, a multi-wafer deposition chamber, a stationary deposition chamber, or a continuous feed deposition chamber. One continuous feed deposition chamber that may be utilized for growing, depositing, or otherwise forming Group III-V materials is described in the commonly assigned U.S. Ser. Nos. 12/475,131 and 12/475,169, both filed on May 29, 2009, which are herein incorporated by reference.

In one embodiment, one or more buffer layers 102 may be formed on the growth wafer 101 in order to start forming the photovoltaic unit 90. The growth wafer 101 may contain an n-type or semi-insulating material, and may contain the same or similar material as the one or more subsequently deposited buffer layers. For example, the growth wafer 101 may contain gallium arsenide, or n-doped gallium arsenide, when creating a gallium arsenide, or n-doped gallium arsenide, buffer layer. The p-dopants may be selected from carbon, magnesium, zinc, or combinations thereof while the n-dopants may be selected from silicon, selenium, tellurium, or combinations thereof. In some embodiments, p-type dopant precursors may include carbon tetrabromide ($CBr_4$) for a carbon dopant, bis(cyclopentadienyl)magnesium ($Cp_2Mg$) for a magnesium dopant, and dialkyl zinc compounds including dimethylzinc or diethylzinc for a zinc dopant. In other embodiments, n-type dopant precursors may include silane ($SiH_4$) or disilane ($Si_2H_6$) for a silicon dopant, hydrogen selenide ($H_2Se$) for a selenium dopant, and dialkyl tellurium compounds including dimethyltellurium, diethyltellurium, and diisopropyltellurium for a tellurium dopant.

The buffer layer 102 or layers may provide an intermediary between the growth wafer 101 and the semiconductor layers of the final photovoltaic unit that can accommodate their different crystallographic structures as the various epitaxial layers are formed. The one or more buffer layers 102 may be deposited to a thickness from about 100 nm to about 600 nm, such as a thickness of about 500 nm, for example. Each of the one or more buffer layers 102 may contain a Group III-V compound semiconductor, such as gallium arsenide, depending on the desired composition of the final photovoltaic unit. The buffer layer 102 may also be doped, such as an n-doped material, for example n-doped gallium arsenide.

A sacrificial layer 104 may be deposited on the buffer layer 102. The sacrificial layer 104 may contain a suitable material, such as aluminum arsenide or an aluminum arsenide alloy, and may be deposited to have a thickness within a range from about 3 nm to about 20 nm, such as from about 5 nm to about 10 nm, for example, about 10 nm. The sacrificial layer 104 may also be doped, such as an n-doped material, for example n-doped aluminum arsenide. The sacrificial layer 104, also known as the release layer, is etched and removed while separating the gallium arsenide based cell 140 from the growth wafer 101 during the ELO process. Prior to being etched, the sacrificial layer 104 is also utilized to form the lattice structure for the subsequently and epitaxially grown layers contained within the gallium arsenide based cell 140, such as the n-type contact layer 105.

The gallium arsenide based cell 140 includes an n-type film stack 120 containing n-doped gallium arsenide materials disposed over a p-type film stack 130 which contain p-doped gallium arsenide materials. Each of the n-type film stack 120 and the p-type film stack 130 independently contains multiple layers of varying compositions of materials including gallium arsenide materials. In one embodiment, the n-type film stack 120 includes an n-type contact layer 105, an n-type front window 106, an n-type absorber layer 108 formed adjacent the n-type front window 106, and optionally, an intermediate layer 114. The p-type film stack 130 includes a p-type emitter layer 110 and a p-type contact layer 112 formed on the p-type emitter layer 110.

During a fabrication process, as described in one embodiment, the n-type contact layer 105, or interface layer, may be deposited on the sacrificial layer 104. The n-type contact layer 105 contains Group III-V materials, such as gallium arsenide, depending on the desired composition of the final photovoltaic unit. The n-type contact layer 105 is n-doped, and for some embodiments, the doping concentration may be within a range greater than about $1 \times 10^{18}$ atoms/cm$^3$, such as greater than to $6 \times 10^{18}$ atoms/cm$^3$, for example, from greater than about $1 \times 10^{18}$ atoms/cm$^3$ to about $1 \times 10^{19}$ atoms/cm$^3$. The n-type contact layer 105 may be formed at a thickness within a range from about 10 nm to about 1,000 nm or from about 10 nm to about 100 nm, such as from about 25 nm to about 75 nm, for example, about 50 nm. The n-type contact layer 105 may be formed at this stage, such as a part of the gallium arsenide based cell 140 prior to the ELO process. Alternatively, in another embodiment, the n-type contact layer 105 may be formed at a later stage subsequent to the ELO process. One advantage to forming the n-type contact layer 105 as a part of the gallium arsenide based cell 140 prior to the ELO process is that the n-type contact layer 105 helps to protect the n-type front window 106 from undesired damage or material contamination during subsequent processing steps, such as while etching the sacrificial layer 104 during the ELO process.

An n-type front window 106, also known as a passivation layer, may be formed on the sacrificial layer 104, or if present, on the optional contact layer 105. The n-type front window 106 may contain a Group III-V material such as aluminum gallium, aluminum gallium arsenide, alloys thereof, or combinations thereof. The n-type front window 106 material may be n-doped, and for some embodiments, the doping concentration may be within a range greater than about $1 \times 10^{18}$ atoms/cm$^3$, such as greater than to $3 \times 10^{18}$ atoms/cm$^3$, for example, from greater than about $1 \times 10^{18}$ atoms/cm$^3$ to about $1 \times 10^{19}$ atoms/cm$^3$. The n-type front window 106 material may be non-doped. The aluminum gallium arsenide may have the formula of molar ratios, the $Al_xGa_{1-x}As$, for example, a molar ratio of $Al_{0.3}Ga_{0.7}As$. The n-type front window 106 may be deposited to have a thickness within a range from about 5 nm to about 75 nm, for example, about 30 nm or about 40 nm. The n-type front window 106 may be transparent to allow photons to pass through the n-type front window 106 on the front side of the gallium arsenide based cell 140 to other underlying layers.

Alternatively, the n-type front window 106 may contain a material such as aluminum gallium phosphide, aluminum gallium indium phosphide, alloys thereof, derivatives thereof, or combinations thereof. These aluminum gallium phosphide compounds provide for a large band gap, such as about 2.2 eV, as well as high collector efficiency at lower wavelengths when utilized within the n-type front window 106.

An absorber layer 108 may be formed on the front window 106. The absorber layer 108 may contain a Group III-V compound semiconductor, such as gallium arsenide. The absorber layer 108 may be monocrystalline. The absorber layer 108 may, for example, have only one type of doping, for example, n-doping, and for some embodiments, the doping concentration of the n-type absorber layer 108 may be within a range from about $1 \times 10^{16}$ atoms/cm$^3$ to about $1 \times 10^{19}$ atoms/cm$^3$, for example, about $1\times10^{17}$ atoms/cm$^3$. The thickness of the n-type absorber layer 108 may be within a range from about 300 nm to about 3,500 nm, such as from about 1,000 nm to about 2,000 nm (about 1.0 µm to about 2.0 µm), for example, 2,000 nm.

As illustrated in FIG. 1B, an emitter layer 110, also referred to in some embodiments as a back window, may be formed adjacent the absorber layer 108. The emitter layer 110 may, for example, be p-doped. The p-type emitter layer 110 may contain a Group III-V compound semiconductor for forming a heterojunction with the n-type absorber layer 108. For example, if the n-type absorber layer 108 contains gallium arsenide, the p-type emitter layer 110 may contain a different semiconductor material, such as aluminum gallium arsenide. If the p-type emitter layer 110 and the n-type front window 106 both contain aluminum gallium arsenide, the $Al_xGa_{1-x}As$ composition of the p-type emitter layer 110 may be the same as or different than the $Al_yGa_{1-y}As$ composition of the n-type front window 106. For example, the p-type emitter layer 110 may have a molar ratio of $Al_{0.3}Ga_{0.7}As$. The p-type emitter layer 110 may be monocrystalline. The p-type emitter layer 110 may be heavily p-doped and for some embodiments, the doping concentration of the p-doped emitter layer may be within a range from about $1\times10^{17}$ atoms/cm$^3$ to about $1\times10^{20}$ atoms/cm$^3$, such as about $1\times10^{19}$ atoms/cm$^3$. The thickness of the p-type emitter layer 110 may be within a range from about 100 nm to about 500 nm, for example, about 300 nm. For some embodiments, the n-type absorber layer 108 may have a thickness of about 800 nm or less, such as about 500 nm or less, such as within a range from about 100 nm to about 500 nm.

In some embodiments, the contact of the n-type absorber layer 108 with the p-type emitter layer 110 creates a p-n interface layer for absorbing photons. In embodiments in which the n-type absorber layer 108 contains one material (such as gallium arsenide) and the p-type emitter layer 110 contains a different material having a different bandgap than the material of the absorber layer 108 (such as aluminum gallium arsenide), the p-n interface layer is a heterojunction. Heterojunctions, as described in embodiments herein, are observed to have reduced dark current, improved voltage productions, and improved radiative recombinations as compared to homojunctions of the conventional photovoltaic materials. In some embodiments described herein, the material of the p-type emitter layer 110 has a higher bandgap than the material of the n-type absorber layer 108.

When light is absorbed near the p-n interface layer to produce electron-hole pairs, the built-in electric field caused by the p-n junction may force the holes to the p-doped side and the electrons to the n-doped side. This displacement of free charges results in a voltage difference between the n-type absorber layer 108 and the p-type emitter layer 110 such that electron current may flow when a load is connected across terminals coupled to these layers.

In some embodiments described herein, the p-type emitter layer 110 is closer than the n-type absorber layer 108 to the back side of the cell 140, i.e., the n-type absorber layer is closer to the front side of the cell 140. This arrangement of emitter layer under absorber layer can in some embodiments provide single carrier transport in the solar cell, in which the emitter and p-n junction are provided closer to the back side of the cell such that the absorber layer absorbs most of the incident photons on the device and generates most of the carriers, such that substantially a single type of carrier is generated. For example, with the emitter layer 110 being made of a higher bandgap material than the absorber layer, the emitter layer is more suited to absorb blue-spectrum photons which do not penetrate as far into the device and thus not as many of these photons reach the emitter layer that is further from the top side than the absorber layer 108.

Fabricating a thinner base/absorber layer according to some embodiments described herein allows use of an n-doped base/absorber layer. The higher mobility of electrons in an n-doped layer compared to the mobility of holes in a p-doped layer can lead to lower doping density in the n-type absorber layer 108 as described by embodiments herein. Other embodiments may use a p-doped base/absorber layer and an n-doped back/emitter layer. For example, the base/absorber layer may be p-doped in embodiments having a thicker absorber layer due to the diffusion length of the carriers.

In other embodiments, as shown in FIG. 1B, an intermediate layer 114 may be formed between the n-type absorber layer 108 and the p-type emitter layer 110. The intermediate layer 114 can provide a material transition between the n-type absorber layer 108 and the p-type emitter layer 110.

FIG. 10 shows a portion of one embodiment 150 of cell 140 including absorber layer 108, an intermediate layer 114, and emitter layer 110. In some embodiments, the intermediate layer 114 contains the same or substantially the same material as the emitter layer 110, e.g., such as aluminum gallium arsenide in embodiments in which the emitter layer 110 contains aluminum gallium arsenide. In addition, the intermediate layer 114 has the same type of doping as the absorber layer 108. For example, the intermediate layer may have the formula of molar ratios of $Al_xGa_{1-x}As$, for example a molar ratio of $Al_{0.3}Ga_{0.7}As$, and be n-doped within a range from about $1\times10^{16}$ atoms/cm$^3$ to about $1\times10^{19}$ atoms/cm$^3$, for example $1\times10^{17}$ atoms/cm$^3$. The dopant concentrations can be the same or substantially the same as the n-type absorber layer 108. In some embodiments the intermediate layer 114 can have a thickness of about two depletion lengths, where a depletion length is the width of the depletion region formed around the p-n junction. For example, in some embodiments the intermediate layer 114 can have a thickness in the range of about 0 to 200 nm.

This embodiment of the cell 140 provides a structure that allows the p-n junction that generates voltage for the cell to be offset from the heterojunction provided by materials having different bandgaps. For example, the p-n junction 152 is at the interface between the n-type and p-type materials of the emitter layer 110 and the intermediate layer 114. Thus, in one described embodiment, the p-n junction is provided at least partially within the higher-bandgap material of which the emitter layer 110 and intermediate layer 114 are composed (e.g., AlGaAs), and the heterojunction 122 is located at the interface between the intermediate layer 114 and the absorber layer 108 (e.g., the interface between GaAs and AlGaAs). This offset provides some advantages over a coincident p-n junction and heterojunction. For example, the offset p-n junction provided between the AlGaAs layers can reduce barrier effects of an interface between the AlGaAs and GaAs layers. In some embodiments, a majority of the absorber layer 108 is outside of a depletion region formed by the p-n junction.

In some embodiments, the heterojunction 154 is located within two depletion lengths of the p-n junction 152. For example, a depletion region may be about 1000 Å (100 nm) wide in some embodiments. The depletion region typically still has a depletion effect past this region, within about two depletion region widths (depletion lengths) of the p-n junction. A heterojunction located further than this distance from the p-n junction may not allow the depletion effect to span the heterojunction interface and a barrier may thus exist.

Figure 1C:
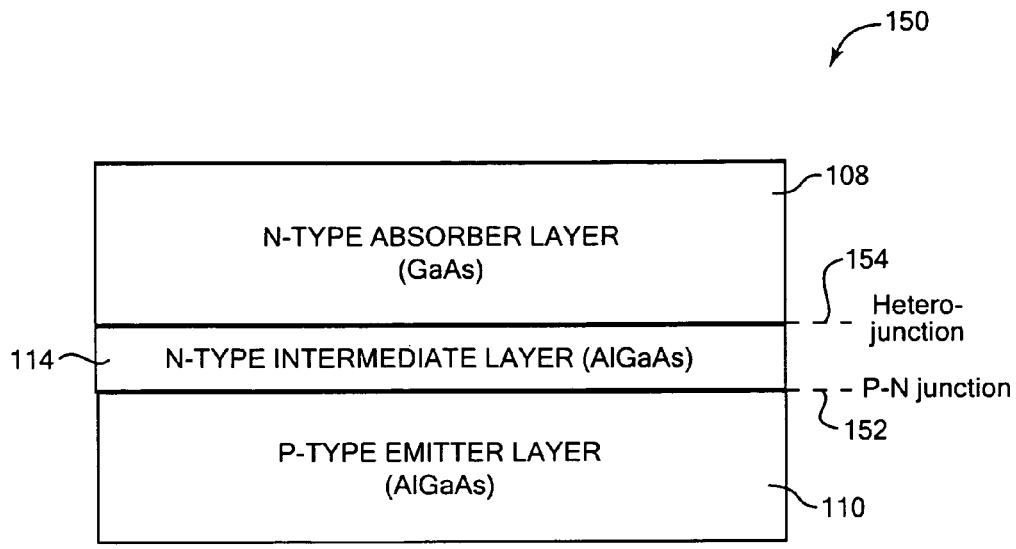
FIGS. 1C-1D depict cross-sectional views of a portion of the photovoltaic units of FIGS. 1A-1B in accordance with different embodiments described herein.
Figure 1D:
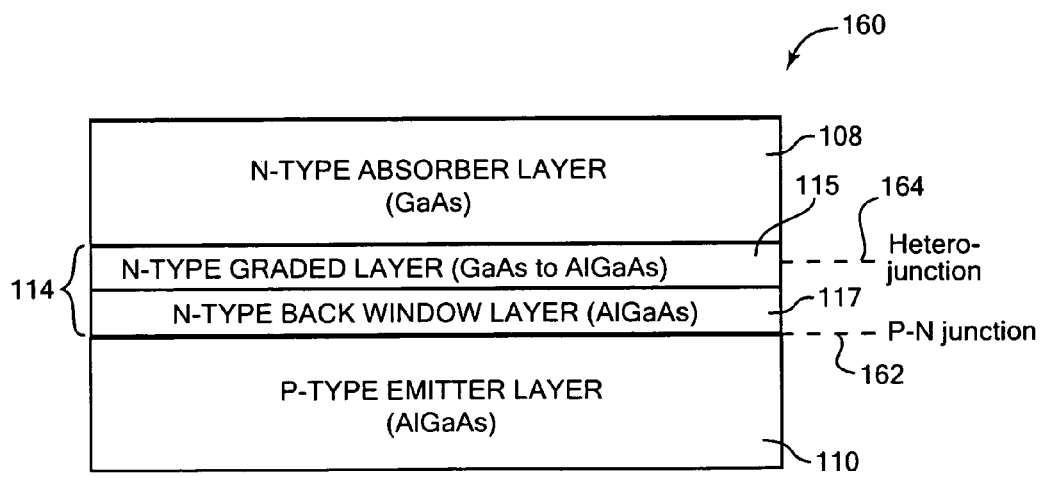

As shown in FIG. 1D, in another embodiment 160 of the intermediate layer 114, the intermediate layer 114 can contain a graded layer 115 and a back window layer 117 disposed between the absorber layer 108 and the emitter layer 110. For example, an n-type graded layer 115 can be formed over the n-type absorber layer 108 and an n-type back window 117 can be formed over the n-type graded layer 115, prior to forming the p-type emitter layer 110 over n-type back window 117. Each of the graded layer 115 and the n-type back window 117 may be n-doped, and for some embodiments, the doping concentration may be within a range from about $1 \times 10^{16}$ atoms/cm$^3$ to about $1 \times 10^{19}$ atoms/cm$^3$, for example $1 \times 10^{17}$ atoms/cm$^3$, and the dopant concentrations are preferably the same or substantially the same as the n-type absorber layer 108. The thicknesses of the graded layer 115 and the back window 117 can vary widely in different embodiments, while the entire intermediate layer 114 can maintain a standard thickness (e.g., about 2 depletion lengths, such as in the range of 0 to 200 nm in some embodiments). The back window 117 can also provide passivation to reduce recombination at the surface of the absorber layer 108.

The embodiment of 160 includes a p-n junction 162 formed between the n-doped layer 117 and the p-doped layer 110. The p-n junction 162 is offset from the heterojunction 164 provided between two materials having different bandgaps. In the example of embodiment 160, the materials are GaAs in absorber layer 108 and AlGaAs in the graded layer 115. Although the heterojunction 164 is shown in FIG. 1D for illustrative purposes at a midpoint in the graded layer, due to the material gradation the heterojunction may be at any point within the layer 115 or the entire width of the layer may be considered the heterojunction. As in the embodiment of FIG. 1C, the p-n junction is preferably offset from the heterojunction within two depletion lengths.

The graded layer 115 may be a graded layer that includes a material gradation ranging from the absorber layer to the back window 117, where the gradation ranges from the material of the absorber layer at the graded layer side closer to the absorber layer, to the material of the back window 117 at the side closer to the back window. Thus, using the example materials described above, the gradation material may start as gallium arsenide adjacent the n-type absorber layer 108, and have a gradation in the direction of the back window of an increasing amount of aluminum and a decreasing amount of GaAs, such that the gradation ends adjacent the n-type back window 117 with about the same aluminum gallium arsenide material (molar ratios) as the material of back window 117. In many examples, the aluminum gallium arsenide at the window end of the gradation may have the formula of molar ratios, $Al_xGa_{1-x}As$; for example, a molar ratio of $Al_{0.3}Ga_{0.7}As$ can be used. The gradation of the graded layer 115 may be parabolic, exponential or linear in gradation. The n-type back window 117 may also contain aluminum gallium arsenide and may have the formula of molar ratios, the $Al_xGa_{1-x}As$, for example, a molar ratio of $Al_{0.3}Ga_{0.7}As$. In other embodiments, the intermediate layer 114 contains only the graded layer 115, or the intermediate layer 114 contains only the non-graded back window 117 (as shown in FIG. 10).

Optionally, a p-type contact layer 112 may be formed on the p-type emitter layer 110. The p-type contact layer 112 may contain a Group III-V compound semiconductor, such as gallium arsenide. The p-type contact layer 112 is generally monocrystalline and p-doped, and for some embodiments, the doping concentration of the p-type contact layer 112 may be greater than $1 \times 10^{18}$ atoms/cm$^3$, such as from about $6 \times 10^{18}$ atoms/cm$^3$ to about $2 \times 10^{19}$ atoms/cm$^3$, for example, about $1 \times 10^{19}$ atoms/cm$^3$. The p-type emitter layer 110 may have a thickness within a range from about 10 nm to about 100 nm, for example, about 50 nm.

Once the p-type emitter layer 110 has been formed, cavities or recesses (not shown) may be formed in the p-type emitter layer 110 (or optional p-type contact layer 112) deep enough to reach the underlying base n-type absorber layer 108. Such recesses may be formed by applying a mask to the p-type emitter layer 110 (or optional p-type contact layer 112) using photolithography, for example, and removing the material in the p-type emitter layer 110 (and optional p-type contact layer 112) not covered by the mask using a technique, such as wet or dry etching. In this manner, the n-type absorber layer 108 may be accessed via the back side of the gallium arsenide based cell 140.

In other embodiments, the opposite type of doping can be used in the layers discussed above, and/or other materials can be used that can provide the described heterojunction and p-n junction. Furthermore, in other embodiments the layers can be deposited or formed in a different order than the order described above.

A photovoltaic unit created in this manner has a significantly thin absorber layer, for example, less than 500 nm) compared to conventional solar units, which may be several micrometers thick. The thickness of the absorber layer is proportional to dark current levels in the photovoltaic unit (e.g., the thinner the absorber layer, the lower the dark current). Dark current is the small electric current that flows through the photovoltaic unit or other similar photosensitive device, for example, a photodiode, even when no photons are entering the device. This background current may be present as the result of thermionic emission or other effects. Because the open circuit voltage ($V_{oc}$) increases as the dark current is decreased in a photosensitive semiconductor device, a thinner absorber layer may most likely lead to a greater $V_{oc}$ for a given light intensity and, thus, increased efficiency. As long as the absorber layer is able to trap light, the efficiency increases as the thickness of the absorber layer is decreased.

The thinness of the absorber layer may not only be limited by the capabilities of thin film technology and ELO. For example, efficiency increases with the thinness of the absorber layer, but the absorber layer should be thick enough to carry current. However, higher doping levels may allow current to flow, even in very thin absorber layers. Therefore, increased doping may be utilized to fabricate very thin absorber layers with even greater efficiency. Conventional photovoltaic devices may suffer from volume recombination effects, and therefore, such conventional devices do not employ high doping in the absorber layer. The sheet resistance of the absorber layer may also be taken into consideration when determining the appropriate thickness.

Photovoltaic devices which contain a thin absorber layer as described herein are usually more flexible than conventional solar cells having a thickness of several micrometers. Also, the thin absorber layers as described herein provide increased efficiency over conventional solar cells. Therefore, photovoltaic units according to embodiments may be appropriate for a greater number of applications than conventional solar cells.

Figure 2:
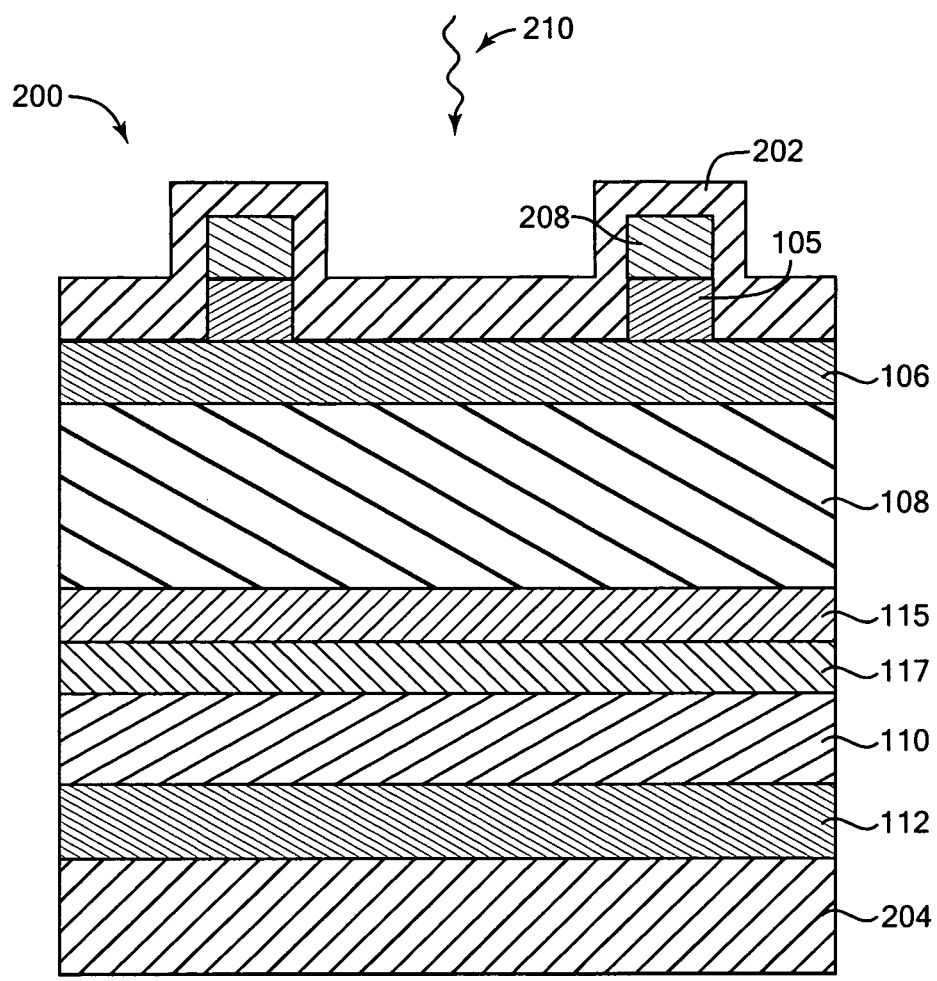
FIG. 2 depicts a cross-sectional view of a two-sided photovoltaic cell in accordance with some embodiments described herein.

FIG. 2 depicts one embodiment of a photovoltaic cell 200 which is a two-sided photovoltaic device and therefore contains each of the contacts, such as the p-metal contact layer 204 and the n-metal contact layer 208, disposed on opposite sides of photovoltaic cell 200. The n-metal contact layer 208 is disposed on the front side or sun side to receive light 210 while the p-metal contact layer 204 is disposed on the back side of photovoltaic cell 200. The photovoltaic cell 200 may be formed from the gallium arsenide based cell 140, as depicted in FIG. 1B, and as described by embodiments herein.

In one embodiment, an n-metal contact layer 208 is deposited on the n-type contact layer 105 and subsequently, recesses are formed through the n-metal contact layer 208 and the n-type contact layer 105 to expose the n-type front window 106 on the front side of the photovoltaic cell 200. In an alternative embodiment, recesses may be initially formed in the n-type contact layer 105 to expose the n-type front window 106 on the front side of the photovoltaic cell 200. Thereafter, the n-metal contact layer 208 may be formed on the remaining portions of the n-type contact layer 105 while leaving exposed the n-type front window 106. The n-type contact layer 105 contains n-doped gallium arsenide materials which may have a dopant concentration of greater than about $3 \times 10^{18}$ atoms/cm$^3$, such as within a range from greater than about $6 \times 10^{18}$ atoms/cm$^3$ to about $1 \times 10^{19}$ atoms/cm$^3$.

An anti-reflective coating (ARC) layer 202 may be disposed over the exposed n-type front window 106, as well as the n-type contact layer 105 and the n-metal contact layer 208, in accordance with an embodiment. The ARC layer 202 contains a material that allows light to pass through while preventing light reflection from the surface of the ARC layer 202. For example, the ARC layer 202 may contain magnesium fluoride, zinc sulfide, titanium oxide, silicon oxide, derivatives thereof, or combination thereof. The ARC layer 202 may be applied to the n-type front window 106 by a technique, such as sputtering. The ARC layer 202 may have a thickness within a range from about 25 nm to about 200 nm, such as from about 50 nm to about 150 nm.

For some embodiments, the n-type front window 106, the p-type emitter layer 110, and/or the p-type contact layer 112 may be roughened or textured before applying the ARC layer 202. Each of the n-type front window 106, the p-type emitter layer 110, and/or the p-type contact layer 112 may be roughened by an etching process, such as a wet etching process or a dry etching process. Texturing may be achieved by applying small particles, such as polystyrene spheres, to the surface of the n-type front window 106 before applying the ARC layer 202. By roughening or texturing the n-type front window 106, the p-type emitter layer 110, and/or the p-type contact layer 112, different angles are provided at the interface between the ARC layer 202 and the n-type front window 106, which may have different indices of refraction. In this manner, more of the incident photons may be transmitted into the n-type front window 106 rather than reflected from the interface between the ARC layer 202 and the n-type front window 106 because some angles of incidence for photons are too high according to Snell's Law. Thus, roughening or texturing the n-type front window 106, the p-type emitter layer 110, and/or the p-type contact layer 112 may provide increased trapping of light.

In some embodiments, the n-type front window 106 may contain multiple window layers. For these embodiments, the outermost window layer (e.g., the window layer closest to the front side of the photovoltaic cell 200) may be roughened or textured as described above before the ARC layer 202 is applied, as illustrated in FIG. 2. In one embodiment, the n-type front window 106 contains a first window layer (not shown) disposed adjacent to the n-type absorber layer 108 and a second window layer (not shown) interposed between the first window layer and the ARC layer 202. The first and second window layers may contain any material suitable for the n-type front window 106 as described above, such as aluminum gallium arsenide, but typically with different compositions. For example, the first window layer may contain $Al_{0.3}Ga_{0.7}As$, and the second window layer may contain $Al_{0.1}Ga_{0.9}As$. Furthermore, some of the multiple window layers may be doped, while others are undoped for some embodiments. For example, the first window layer may be doped, and the second window layer may be undoped.

The p-metal contact layer 204 and/or the n-metal contact layer 208 each contain contact materials which are electrically conductive materials, such as metals or metal alloys. Preferably, the contact materials contained within the p-metal contact layer 204 and/or the n-metal contact layer 208 do not diffuse through other layers, such as a semiconductor layer, during any of the process steps utilized during the fabrication of the photovoltaic cell 200. Usually, each of the p-metal contact layer 204 and the n-metal contact layer 208 contains multiple layers of the same or different contact materials. The contact materials preferably have specific contact resistance of $1 \times 10^{-3}$ Ω-cm$^2$ or less. Preferred contact materials also have Schottky barrier heights ($\Phi_{bn}$) of about 0.8 eV or greater at carrier concentrations of about $1 \times 10^{18}$ atoms/cm$^3$. Suitable contact materials may include gold, copper, silver, aluminum, palladium, platinum, titanium, zirconium, nickel, chromium, tungsten, tantalum, ruthenium, zinc, germanium, palladium germanium alloy, derivatives thereof, alloys thereof, or combinations thereof.

In some embodiments described herein, the p-metal contact layer 204 and/or the n-metal contact layer 208 may be fabricated on the photovoltaic cell 200 by a method, such as vacuum-evaporation through a photoresist, photolithography, screen printing, or merely depositing on the exposed surface of the photovoltaic cell 200 that have been partially covered with a resist mask, a wax, or another protective material.

Optionally, a metal protective layer, or metal adhesion layer, may be deposited on the p-metal contact layer 204. The metal protective layer may contain a material including nickel, chromium, titanium, alloys thereof, or combinations thereof. The metal protective layer preferably exhibits good adhesion to p-doped gallium arsenide. In one example embodiment, the metal protective layer may be deposited to a thickness within a range from about 5 Å to about 20 Å and have a reflectance of about 80% or greater. Preferably, the material of the metal protective layer and deposition thickness are deposited to minimize any interference with the reflectiveness of the p-metal contact layer 204. The metal protective layer may be deposited by an electron beam deposition process or a PVD process, also known as a sputtering process.

Some example embodiments of p-metal contact layer 204, n-metal contact layer 208, and other contact, adhesion, and reflector layers suitable for use with contact layers of the cell 200 are described in copending U.S. patent application Ser. No. 12/939,050, entitled, "Metallic Contacts for Photovoltaic Devices and Low-Temperature Fabrication Processes Thereof," filed on an even date herewith, and which is incorporated herein by reference. Other types, structures, and materials of metal contact layers can also be used with cell 200.

Figure 3:
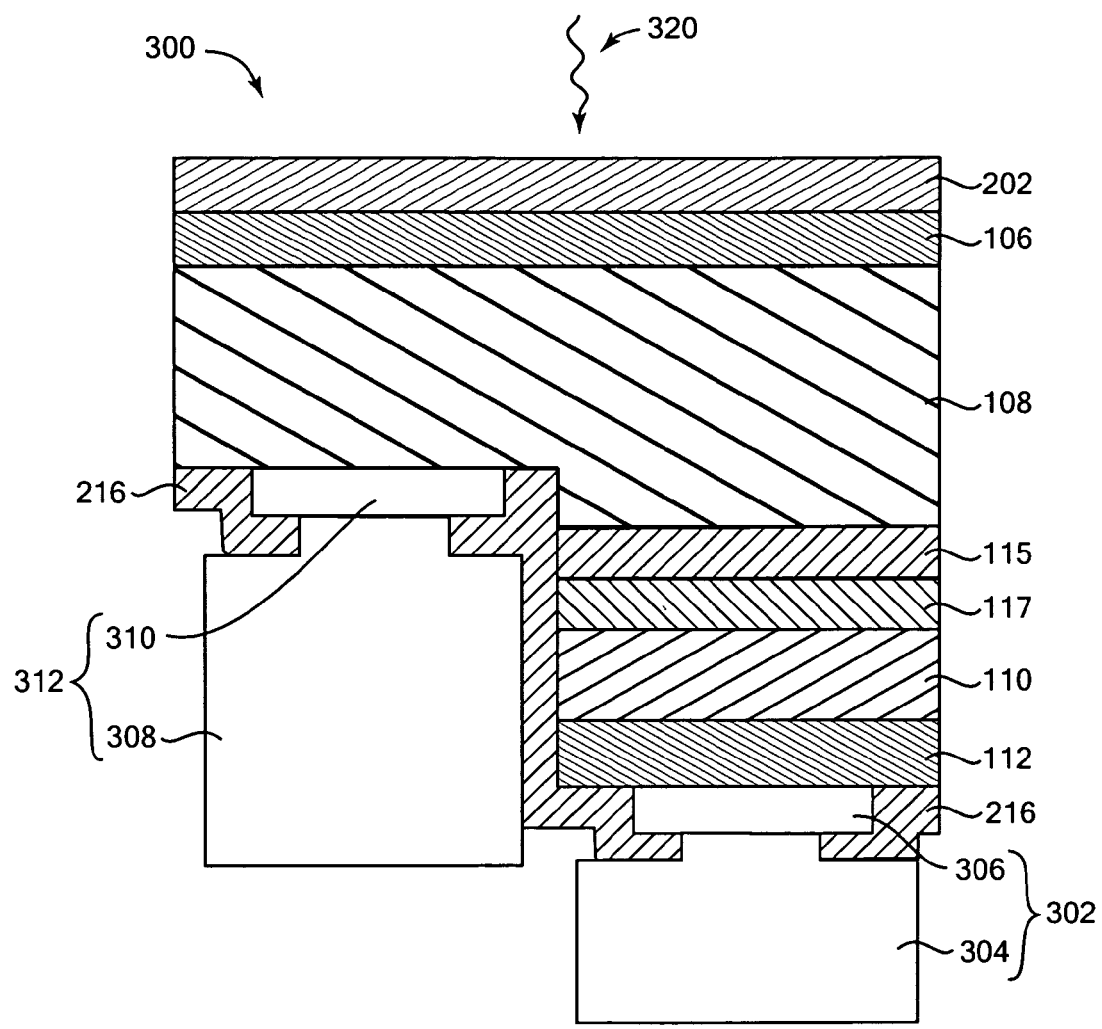
FIG. 3 depicts a cross-sectional view of a single-sided photovoltaic cell in accordance with other embodiments described herein.

FIG. 3 depicts a photovoltaic cell 300 which is a single-sided photovoltaic device and therefore contains both contacts, such as the p-metal contact 302 and the n-metal contact 312, disposed on the same side of photovoltaic cell 300, as described by other embodiments herein. As shown in FIG. 3, both the p-metal contact 302 and the n-metal contact 312 are on the back side of the photovoltaic cell 300 while the ARC layer 202 is on the sun side or front side of the photovoltaic cell 300 that receives light 320. The p-metal contact 302 contains a p-metal contact layer 304 disposed on a p-metal contact layer 306, while the n-metal contact 312 contains an n-metal contact layer 308 disposed on an n-metal alloy contact 310, in some embodiments described herein.

In some embodiments, the photovoltaic cell 300 may be formed from the gallium arsenide based cell 140 of FIG. 1B. In one example, a resist mask may be formed on the exposed surface of the p-type contact layer 112 and pattern recesses and holes may be formed during a photolithography process. The pattern recesses and holes extend through the p-type contact layer 112, the p-type emitter layer 110, the n-type back window 117, and the graded layer 115, and partially into the n-type absorber layer 108. Thereafter, the resist mask is removed to reveal the n-type absorber layer 108 and the p-type contact layer 112 as the exposed surfaces on the back side of the photovoltaic cell 300, as viewed from the two-dimensional perspective towards the back side of the photovoltaic cell 300. The sidewalls of the recesses and holes reveal exposed surfaces of the p-type contact layer 112, the p-type emitter layer 110, the n-type back window 117, and the graded layer 115, and partially into the n-type absorber layer 108.

In one embodiment, the p-metal contact layer 306 is formed on a portion of the exposed the p-type contact layer 112 and the n-metal alloy contact 310 is formed on a portion of the exposed the n-type absorber layer 108. Thereafter, the insulation layer 216 may be deposited over the surface of the photovoltaic cell 300, such as to cover all exposed surfaces including the p-metal contact layer 306 and the n-metal alloy contact 310. Subsequently, the exposed surfaces of the p-metal contact layer 306 and the n-metal alloy contact 310 are revealed by etching pattern holes into the insulation layer 216 by a lithography process. In some embodiments, the p-metal contact layer 306 and the n-metal alloy contact 310 are formed prior to separating the gallium arsenide based cell 140 from the growth wafer 101 during the ELO process while the insulation layer 216 is formed subsequent to the ELO process. The p-metal contact layer 304 may be formed on the p-metal contact layer 306 and a portion of the insulation layer 216 while the n-metal contact layer 308 may be formed on the n-metal alloy contact 310 and other portions of the insulation layer 216 to form the photovoltaic cell 300, as depicted in FIG. 3. In some examples, the p-metal contact layer 304 and the n-metal contact layer 308 may be formed containing the same compositional layers of material as each other and in other examples, the p-metal contact layer 304 and the n-metal contact layer 308 are simultaneously formed on the photovoltaic cell 300 during the same metallization steps.

In an alternative embodiment, the p-metal contact 302 and the n-metal contact 312 may be fabricated, in whole or in part, and subsequently, the insulation layer 216 may be formed over and on the sidewalls of the recesses between and around the p-metal contact 302 and the n-metal contact 312. In another alternative embodiment, the insulation layer 216, in whole or in part, may be formed on the photovoltaic cell 300 prior to forming the p-metal contact 302 and the n-metal contact 312.

Despite all the contacts, such as the p-metal contact 302 and the n-metal contact 312, being on the back side of the photovoltaic cell 300 to reduce solar shadows, dark current and its stability with time and temperature may still be concerns when designing an efficient photovoltaic device, such as the photovoltaic cell 300. Therefore, for some embodiments, an insulation layer 216 may be deposited or otherwise formed on the back side of the photovoltaic cell 300. The insulation layer 216 contains an electrically insulating material or grout which helps to reduce the dark current within the photovoltaic cell 300.

The insulation layer 216 may contain an electrically insulating material or grout, such as silicon oxides, silicon dioxide, silicon oxynitride, silicon nitride, polysiloxane or silicone, sol-gel materials, titanium oxide, tantalum oxide, zinc sulfide, derivatives thereof, or combinations thereof. The insulation layer 216 may be formed by a passivation method, such as by a sputtering process, an evaporation process, a spin-coating process, or a CVD process.

In another embodiment, the insulation layer 216 eliminates or substantially reduces electrical shorts from occurring between the p-metal contact 302 and the n-metal contact 312. The insulation layer 216 contains an electrically insulating grout and/or other electrically insulating material that has an electrical resistance of at least 0.5 MΩ (million ohms) or greater, such as within a range from about 1 MΩ to about 5 MΩ, or greater. Exemplary grouts or other electrically insulating materials may contain a polymeric material, such as ethylene vinyl acetate (EVA), polyimide, polyurethane, derivatives thereof, or combinations thereof. In one example, the electrically insulating grout contains a photosensitive polyimide coating. In another example, the electrically insulating grout contains a thermal set polymeric material.

In many embodiments, the n-metal alloy contact 310 may be formed by a low temperature process, which includes low temperature deposition processes followed by a low temperature, thermal anneal process. Suitable contact materials deposited within the n-metal alloy contact 310 by low temperature deposition processes may include palladium, germanium, palladium germanium alloy, titanium, gold, nickel, silver, copper, platinum, alloys thereof, or combinations thereof, among others.

In another embodiment, the n-metal alloy contact 310 may contain multiple layers of conductive materials including a palladium germanium alloy. The n-metal alloy contact 310 is disposed between the n-type absorber layer 108 and the n-metal contact layer 308 for providing a strong ohmic contact therebetween. The palladium germanium alloy within the n-metal alloy contact 310 allows a high conductivity of the electric potential from the gallium arsenide materials within the n-type absorber layer 108, across n-metal alloy contact 310, and to the n-metal contact layer 308. The n-metal alloy contact 310 can also contain a metallic capping layer which can be provided, for example, on the palladium germanium alloy layer. In some embodiments, the capping layer can include an adhesion layer and a high conductivity layer. For example, the adhesion layer can allow the conductivity layer to adhere to the alloy layer. In some examples, the adhesion layer may contain titanium, tin, zinc, alloys thereof, or combinations thereof and the high conductivity layer may contain gold, silver, nickel, copper, aluminum, alloys thereof, or combinations thereof, or a stack of multiple different metal layers and/or alloy layers. In one example, the n-metal alloy contact 310 contains a high conductivity layer containing gold disposed on an adhesion layer containing titanium, which is disposed on a palladium germanium alloy.

Similar fabrication methods and embodiments as described above for the p-metal contact layer 204 and/or the n-metal contact layer 208 on cell 200 can be used for the p-metal contact layer 306 on photovoltaic cell 300. Some example embodiments of n-metal alloy contact 304, p-metal contact 302, n-metal contact 312, n-metal alloy contact 310, and other layers suitable for use with contact layers of the cell 300 are described in copending patent application Ser. No. 12/939,050, entitled, "Metallic Contacts for Photovoltaic Devices and Low-Temperature Fabrication Processes Thereof," filed on an even date herewith, and which is incorporated herein by reference. Other types, structures, and materials of metal contact layers can also be used with cell 300.

While the foregoing is directed to embodiments of the inventions, other and further embodiments of the inventions may be devised without departing from the basic scope thereof, and the scope thereof is determined by the claims that follow.

What is claimed is:

1. An optoelectronic semiconductor device comprising:
   an absorber layer made of gallium arsenide (GaAs) and having only one type of doping;
   an emitter layer located closer than the absorber layer to a back side of the device, the emitter layer made of a different material than the absorber layer and having a higher bandgap than the absorber layer;
   a heterojunction formed between the emitter layer and the absorber layer;
   a p-n junction formed between the emitter layer and the absorber layer at a location offset from the heterojunction, the p-n junction causing a voltage to be generated in the device in response to the device being exposed to light at a front side of the device; and
   an intermediate layer located between the absorber layer and the emitter layer and providing the offset of the p-n junction from the heterojunction, the intermediate layer having the same type of doping as the absorber layer and including the different material,
   wherein the intermediate layer includes:
      a graded layer having a material gradation from GaAs at a side closer to the absorber layer, to the different material of the emitter layer, and
      a back window layer not having the gradation and having an approximately uniform composition of the different material.

2. The optoelectronic semiconductor device of claim 1 wherein the graded layer is located adjacent to the absorber layer, and wherein the back window layer is located between the graded layer and the emitter layer.

3. The optoelectronic semiconductor device of claim 1 wherein the p-n junction is located within two depletion lengths of the heterojunction.

4. The optoelectronic semiconductor device of claim 1 wherein the material of the emitter layer is Aluminum Gallium Arsenide (AlGaAs).

5. The optoelectronic semiconductor device of claim 1 wherein the optoelectronic semiconductor device is a single carrier transport solar cell.

6. The single carrier transport solar cell of claim 5 wherein a majority of the absorber layer is outside of a depletion region formed by the p-n junction.

7. A solar cell comprising:
   an absorber layer made of gallium arsenide (GaAs) and having only one type of doping;
   an emitter layer made of a different material than the absorber layer and having a higher bandgap than the absorber layer;
   an intermediate layer provided between the absorber layer and the emitter layer, the intermediate layer having the same type of doping as the absorber layer, wherein the intermediate layer includes a material gradation from GaAs at a side closer to the absorber layer, to the different material of the emitter layer at a side closer to the emitter layer, wherein the intermediate layer includes:
      (a) a graded layer having the gradation, and
      (b) a back window layer not having the gradation and having an approximately uniform composition of the different material;
   a heterojunction formed between the emitter layer and the absorber layer; and
   a p-n junction formed between the emitter layer and the absorber layer and at least partially within the different material at a location offset from the heterojunction, the p-n junction causing a voltage to be generated in the cell in response to the cell being exposed to light at a front side of the cell.

8. The solar cell of claim 7 wherein the graded layer is located adjacent to the absorber layer, and wherein the back window layer is located between the graded layer and the emitter layer.

9. The solar cell of claim 7 wherein the p-n junction is located within two depletion lengths of the heterojunction.

10. The solar cell of claim 7 wherein the material of the emitter layer is Aluminum Gallium Arsenide (AlGaAs).

11. The solar cell of claim 7 wherein the emitter layer is located closer than the absorber layer to a back side of the device, such that single carrier transport is provided in the cell.

12. The solar cell of claim 7 wherein a majority of the absorber layer is outside of a depletion region formed by the p-n junction.

* * * * *